US010936381B1

(12) United States Patent
Poblete et al.

(10) Patent No.: US 10,936,381 B1
(45) Date of Patent: Mar. 2, 2021

(54) SYSTEM AND METHOD FOR IMPROVING THERMAL PERFORMANCE OF AN INFORMATION HANDLING SYSTEM

(71) Applicant: DELL PRODUCTS, LP, Round Rock, TX (US)

(72) Inventors: Christopher Abella Poblete, Austin, TX (US); Santosh Kumar Bidaralli, Cedar Park, TX (US); Marshal F. Savage, Austin, TX (US)

(73) Assignee: Dell Products, L.P, Round Rock, TX (US)

( * ) Notice: Subject to any disclaimer, the term of this patent is extended or adjusted under 35 U.S.C. 154(b) by 0 days.

(21) Appl. No.: 16/710,578

(22) Filed: Dec. 11, 2019

(51) Int. Cl.
| | |
|---|---|
| *H05K 5/06* | (2006.01) |
| *G06F 9/54* | (2006.01) |
| *H05K 7/14* | (2006.01) |
| *G06F 3/0482* | (2013.01) |
| *G06F 3/0488* | (2013.01) |
| *G08B 5/22* | (2006.01) |

(52) U.S. Cl.
CPC ............ *G06F 9/542* (2013.01); *G06F 3/0482* (2013.01); *G06F 3/04883* (2013.01); *G08B 5/225* (2013.01); *H05K 7/1498* (2013.01)

(58) Field of Classification Search
CPC .... G06F 9/542; G06F 3/0482; G06F 3/04883; G08B 5/225; H05K 7/1498
See application file for complete search history.

(56) References Cited

U.S. PATENT DOCUMENTS

| | | | | |
|---|---|---|---|---|
| 7,154,380 | B1 * | 12/2006 | Tarrab, Jr. ............ | G04G 15/006 340/309.16 |
| 2003/0135767 | A1 * | 7/2003 | Chu .................... | H05K 7/20209 713/300 |
| 2007/0097642 | A1 | 5/2007 | Artman et al. | |
| 2008/0052483 | A1 | 2/2008 | Rangarajan et al. | |
| 2009/0125695 | A1 | 5/2009 | Rangarajan et al. | |
| 2011/0090087 | A1 | 4/2011 | Berke et al. | |
| 2014/0240919 | A1 * | 8/2014 | Alshinnawi ........ | H05K 7/20145 361/679.49 |
| 2015/0358796 | A1 * | 12/2015 | Sarna, II ........... | H04M 1/72538 455/404.2 |
| 2017/0046242 | A1 * | 2/2017 | Ragupathi ........... | G06F 11/0706 |
| 2019/0098795 | A1 * | 3/2019 | Adrian ............... | H05K 7/20145 |

* cited by examiner

*Primary Examiner* — Doon Y Chow
*Assistant Examiner* — Abdou K Seye
(74) *Attorney, Agent, or Firm* — Larson Newman, LLP

(57) ABSTRACT

A server receives an event notification indicating an opening of a drive drawer, and retrieves a timing parameter associated with a timer that counts a time from the receiving of the event notification by the server indicating the opening of the drive drawer. The server may generate a visual alert that alerts of the opening of the drive drawer, and display a current value indicating the time since the receiving of the event notification.

17 Claims, 14 Drawing Sheets

SYSTEM AND METHOD FOR IMPROVING THERMAL PERFORMANCE OF AN INFORMATION HANDLING SYSTEM

FIELD OF THE DISCLOSURE

This disclosure generally relates to information handling systems, and more particularly relates to timer notifications for opening and closing of drive sleds.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

Notifications and alerts of open drive drawers reduce thermal incidents. When a drive drawer is opened for service, a blade server establishes a timer and displays a visual notification. The visual notification alerts a user of a time determined by the timer since the drive drawer was opened for service. The timer increments up or down to a final value at which the user should close the drive drawer to prevent overheating. If multiple drive drawers are opened for service, the blade server may establish multiple timers and queue multiple visual notifications for display. As any drive drawer is closed, the corresponding visual notification is dismissed and a next oldest visual notification in the queue is processed for display. The queue thus helps the user sequentially service the open drive drawers to prevent overheating.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings.

Figure 1:
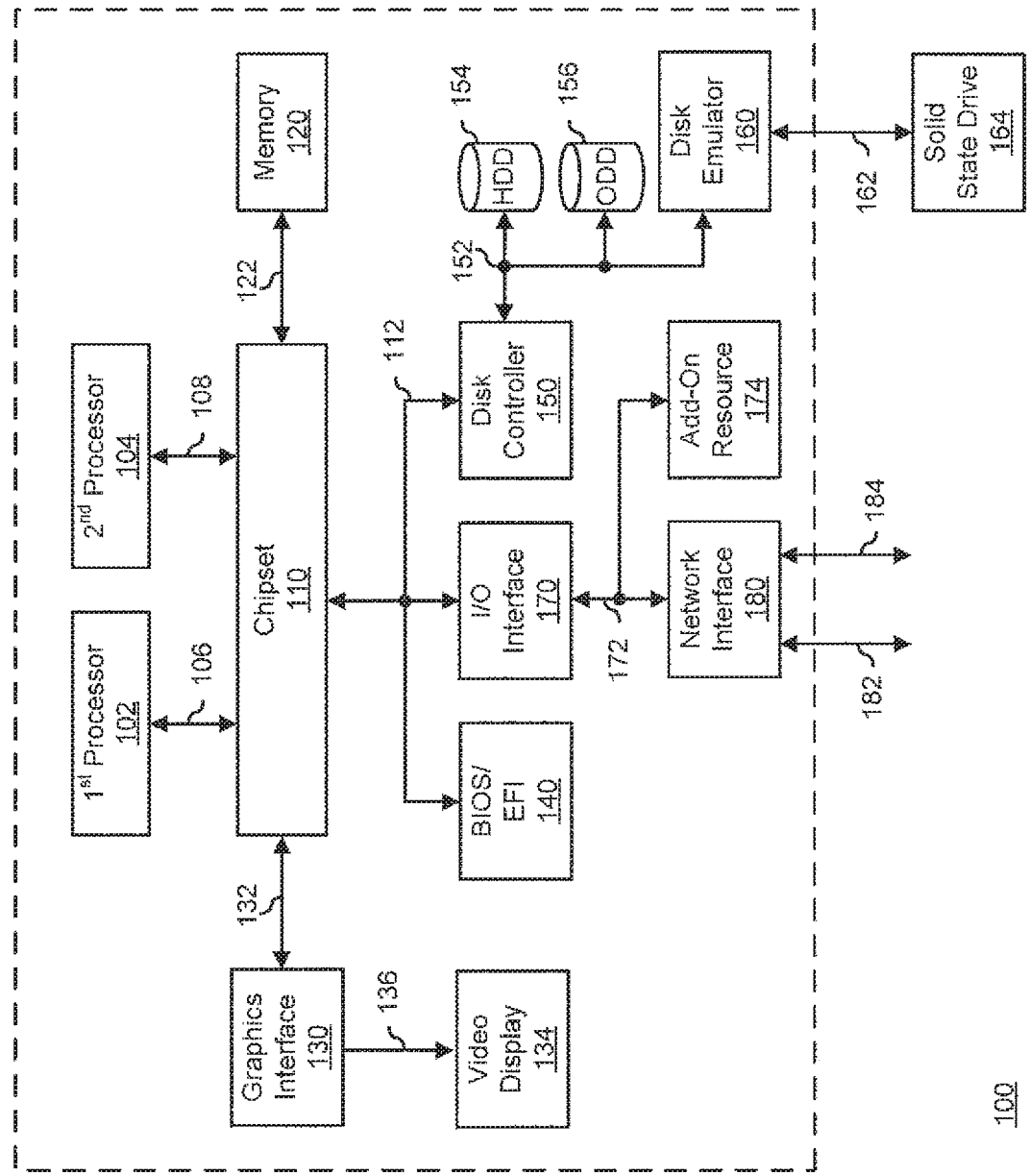
FIG. 1 is a block diagram of a generalized information handling system.

FIG. 1 illustrates an embodiment of an information handling system 100 including processors 102 and 104, chipset 110, memory 120, graphics adapter 130 connected to video display 134, non-volatile RAM (NV-RAM) 140 that includes a basic input and output system/extensible firmware interface (BIOS/EFI) module 142, disk controller 150, hard disk drive (HDD) 154, optical disk drive (ODD) 156, disk emulator 160 connected to solid state drive (SSD) 164, an input/output (I/O) interface 170 connected to an add-on resource 174, a trusted platform module (TPM) 176, a network interface device 180, and a baseboard management controller (BMC) 190. Processor 102 is connected to chipset 110 via processor interface 106, and processor 104 is connected to chipset 110 via processor interface 108.

Chipset 110 represents an integrated circuit or group of integrated circuits that manages data flow between processors 102 and 104 and the other elements of information handling system 100. In a particular embodiment, chipset 110 represents a pair of integrated circuits, such as a north bridge component and a south bridge component. In another embodiment, some or all of the functions and features of chipset 110 are integrated with one or more of processors 102 and 104. Memory 120 is connected to chipset 110 via a memory interface 122. An example of memory interface 122 includes a Double Data Rate (DDR) memory channel, and memory 120 represents one or more DDR Dual In-Line Memory Modules (DIMMs). In a particular embodiment, memory interface 122 represents two or more DDR channels. In another embodiment, one or more of processors 102 and 104 include memory interface 122 that provides a dedicated memory for the processors. A DDR channel and the connected DDR DIMMs can be in accordance with a particular DDR standard, such as a DDR3 standard, a DDR4 standard, a DDR5 standard, or the like. Memory 120 may further represent various combinations of memory types, such as Dynamic Random Access Memory (DRAM) DIMMs, Static Random Access Memory (SRAM) DIMMs, non-volatile DIMMs (NV-DIMMs), storage class memory devices, Read-Only Memory (ROM) devices, or the like.

Graphics adapter 130 is connected to chipset 110 via a graphics interface 132, and provides a video display output 136 to a video display 134. An example of a graphics interface 132 includes a peripheral component interconnectexpress interface (PCIe) and graphics adapter 130 can include a four lane (x4) PCIe adapter, an eight lane (x8) PCIe adapter, a 16-lane (x16) PCIe adapter, or another configuration, as needed or desired. In a particular embodiment, graphics adapter 130 is provided on a system printed circuit board (PCB). Video display output 136 can include a digital video interface (DVI), a high definition multimedia interface (HDMI), DisplayPort interface, or the like. Video display 134 can include a monitor, a smart television, an embedded display such as a laptop computer display, or the like.

NV-RAM 140, disk controller 150, and I/O interface 170 are connected to chipset 110 via I/O channel 112. An example of I/O channel 112 includes one or more point-to-point PCIe links between chipset 110 and each of NV-RAM 140, disk controller 150, and I/O interface 170. Chipset 110 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. NV-RAM 140 includes BIOS/EFI module 142 that stores machine-executable code (BIOS/EFI code) that operates to detect the resources of information handling system 100, to provide drivers for the resources, to initialize the resources, and to provide common access mechanisms for the resources. The functions and features of BIOS/EFI module 142 will be further described below.

Disk controller 150 includes a disk interface 152 that connects the disc controller 150 to HDD 154, to ODD 156, and to disk emulator 160. Disk interface 152 may include an integrated drive electronics (IDE) interface, an advanced technology attachment (ATA) such as a parallel ATA (PATA) interface or a serial ATA (SATA) interface, a SCSI interface, a USB interface, a proprietary interface, or a combination thereof. Disk emulator 160 permits a solid-state drive (SSD) 164 to be connected to information handling system 100 via an external interface 162. An example of external interface 162 includes a USB interface, an IEEE 1394 (Firewire) interface, a proprietary interface, or a combination thereof. Alternatively, SSD 164 can be disposed within information handling system 100.

I/O interface 170 includes a peripheral interface 172 that connects I/O interface 170 to add-on resource 174, to TPM 176, and to network interface device 180. Peripheral interface 172 can be the same type of interface as I/O channel 112, or can be a different type of interface. As such, I/O interface 170 extends the capacity of I/O channel 112 when peripheral interface 172 and the I/O channel are of the same type, and the I/O interface translates information from a format suitable to the I/O channel to a format suitable to the peripheral channel 172 when they are of a different type. Add-on resource 174 can include a sound card, data storage system, an additional graphics interface, another add-on resource, or a combination thereof. Add-on resource 174 can be on a main circuit board, a separate circuit board or an add-in card disposed within information handling system 100, a device that is external to the information handling system, or a combination thereof.

Network interface device 180 represents a network communication device disposed within information handling system 100, on a main circuit board of the information handling system, integrated onto another element such as chipset 110, in another suitable location, or a combination thereof. Network interface device 180 includes a network channel 182 that provides an interface to devices that are external to information handling system 100. In a particular embodiment, network channel 182 is of a different type than peripheral channel 172 and network interface device 180 translates information from a format suitable to the peripheral channel to a format suitable to external devices. In a particular embodiment, network interface device 180 includes a host bus adapter (HBA), a host channel adapter, a network interface card (NIC), or other hardware circuit that can connect the information handling system to a network. An example of network channel 182 includes an InfiniBand channel, a fiber channel, a gigabit Ethernet channel, a proprietary channel architecture, or a combination thereof. Network channel 182 can be connected to an external network resource (not illustrated). The network resource can include another information handling system, a data storage system, another network, a grid management system, another suitable resource, or a combination thereof.

BMC 190 is connected to multiple elements of information handling system 100 via one or more management interface 192 to provide out of band monitoring, maintenance, and control of the elements of the information handling system. As such, BMC 190 represents a processing device different from processors 102 and 104, which provides various management functions for information handling system 100. In an embodiment, BMC 190 may be responsible for granting access to a remote management system that may establish control of the elements to implement power management, cooling management, storage management, and the like. The BMC 190 may also grant access to an external device. In this case, the BMC may include transceiver circuitry to establish wireless communications with the external device such as a mobile device. The transceiver circuitry may operate on a Wi-Fi channel, a near-field communication (NFC) channel, a Bluetooth or Bluetooth-Low-Energy (BLE) channel, a cellular based interface such as a global system for mobile (GSM) interface, a code-division multiple access (CDMA) interface, a universal mobile telecommunications system (UMTS) interface, a long-term evolution (LTE) interface, another cellular based interface, or a combination thereof. A mobile device may include Ultrabook, a tablet computer, a netbook, a notebook computer, a laptop computer, mobile telephone, a cellular telephone, a smartphone, a personal digital assistant, a multimedia playback device, a digital music player, a digital video player, a navigational device, a digital camera, and the like.

The term BMC may be used in the context of server systems, while in a consumer-level device a BMC may be referred to as an embedded controller (EC). A BMC included at a data storage system can be referred to as a storage enclosure processor. A BMC included at a chassis of a blade server can be referred to as a chassis management controller, and embedded controllers included at the blades of the blade server can be referred to as blade management controllers. Out-of-band communication interfaces between BMC and elements of the information handling system may be provided by management interface 192 that may include an inter-integrated circuit (I2C) bus, a system management bus (SMBUS), a power management bus (PMBUS), a low pin count (LPC) interface, a serial bus such as a universal serial bus (USB) or a serial peripheral interface (SPI), a network interface such as an Ethernet interface, a high-speed serial data link such as PCIe interface, a network controller-sideband interface (NC-SI), or the like. As used herein, out-of-band access refers to operations performed apart from a BIOS/operating system execution environment on information handling system 100, that is apart from the execution of code by processors 102 and 104 and procedures that are implemented on the information handling system in response to the executed code.

In an embodiment, the BMC 190 implements an integrated remote access controller (iDRAC) that operates to monitor and maintain system firmware, such as code stored in BIOS/EFI module 142, option ROMs for graphics interface 130, disk controller 150, add-on resource 174, network interface 180, or other elements of information handling system 100, as needed or desired. In particular, BMC 190 includes a network interface 194 that can be connected to a remote management system to receive firmware updates, as needed or desired. Here BMC 190 receives the firmware updates, stores the updates to a data storage device associated with the BMC, transfers the firmware updates to NV-RAM of the device or system that is the subject of the firmware update, thereby replacing the currently operating firmware associated with the device or system, and reboots information handling system, whereupon the device or system utilizes the updated firmware image.

BMC 190 utilizes various protocols and application programming interfaces (APIs) to direct and control the processes for monitoring and maintaining the system firmware. An example of a protocol or API for monitoring and maintaining the system firmware includes a graphical user interface (GUI) associated with BMC 190, an interface defined by the Distributed Management Taskforce (DMTF) (such as Web Services Management (WS-MAN) interface, a Management Component Transport Protocol (MCTP) or, Redfish interface), various vendor defined interfaces (such as Dell EMC Remote Access Controller Administrator (RA-CADM) utility, Dell EMC Open Manage Server Administrator (OMSS) utility, Dell EMC Open Manage Storage Services (OMSS) utility, Dell EMC Open Manage Deployment Toolkit (DTK) suite), representational state transfer (REST) web API, a BIOS setup utility such as invoked by a "F2" boot option, or another protocol or API, as needed or desired.

In a particular embodiment, BMC 190 is included on a main circuit board (such as a baseboard, a motherboard, or any combination thereof) of information handling system 100, or is integrated into another element of the information handling system such as chipset 110, or another suitable element, as needed or desired. As such, BMC 190 can be part of an integrated circuit or a chip set within information handling system 100. BMC 190 may operate on a separate power plane from other resources in information handling system 100. Thus BMC 190 can communicate with the remote management system via network interface 194 or the BMC can communicate with the external mobile device using its own transceiver circuitry while the resources or elements of information handling system 100 are powered off or at least in low power mode. Here, information can be sent from the remote management system or external mobile device to BMC 190 and the information can be stored in a RAM or NV-RAM associated with the BMC. Information stored in the RAM may be lost after power-down of the power plane for BMC 190, while information stored in the NV-RAM may be saved through a power-down/power-up cycle of the power plane for the BMC.

In a typical usage case, information handling system 100 represents an enterprise class processing system, such as may be found in a datacenter or other compute-intense processing environment. Here, there may be hundreds or thousands of other enterprise class processing systems in the datacenter. In such an environment, the information handling system may represent one of a wide variety of different types of equipment that perform the main processing tasks of the datacenter, such as modular blade servers, switching and routing equipment (network routers, top-of-rack switches, and the like), data storage equipment (storage servers, network attached storage, storage area networks, and the like), or other computing equipment that the datacenter uses to perform the processing tasks.

Figure 2:
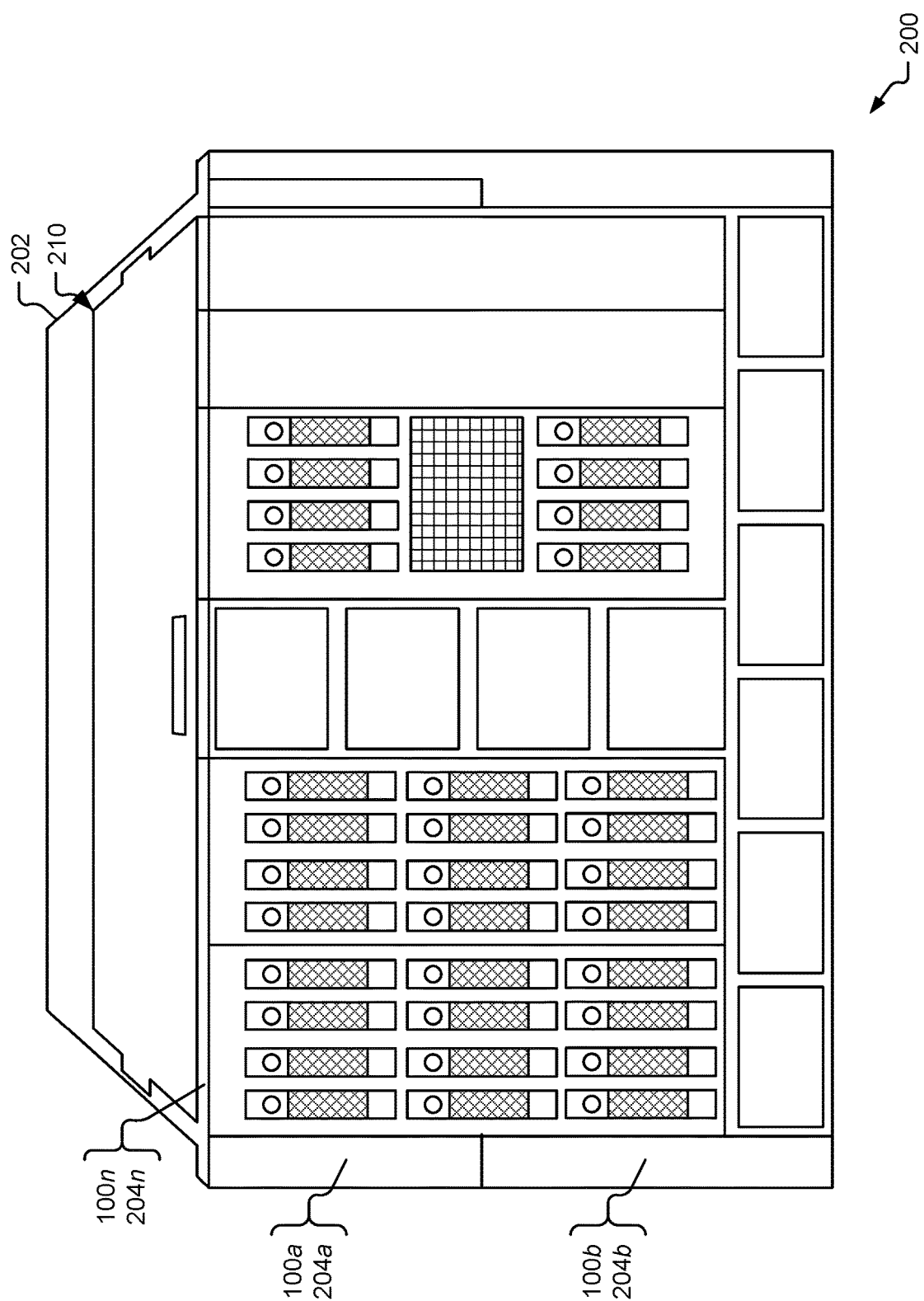
FIGS. 2-4 illustrate a blade server ecosystem, according to exemplary embodiments.
Figure 3:
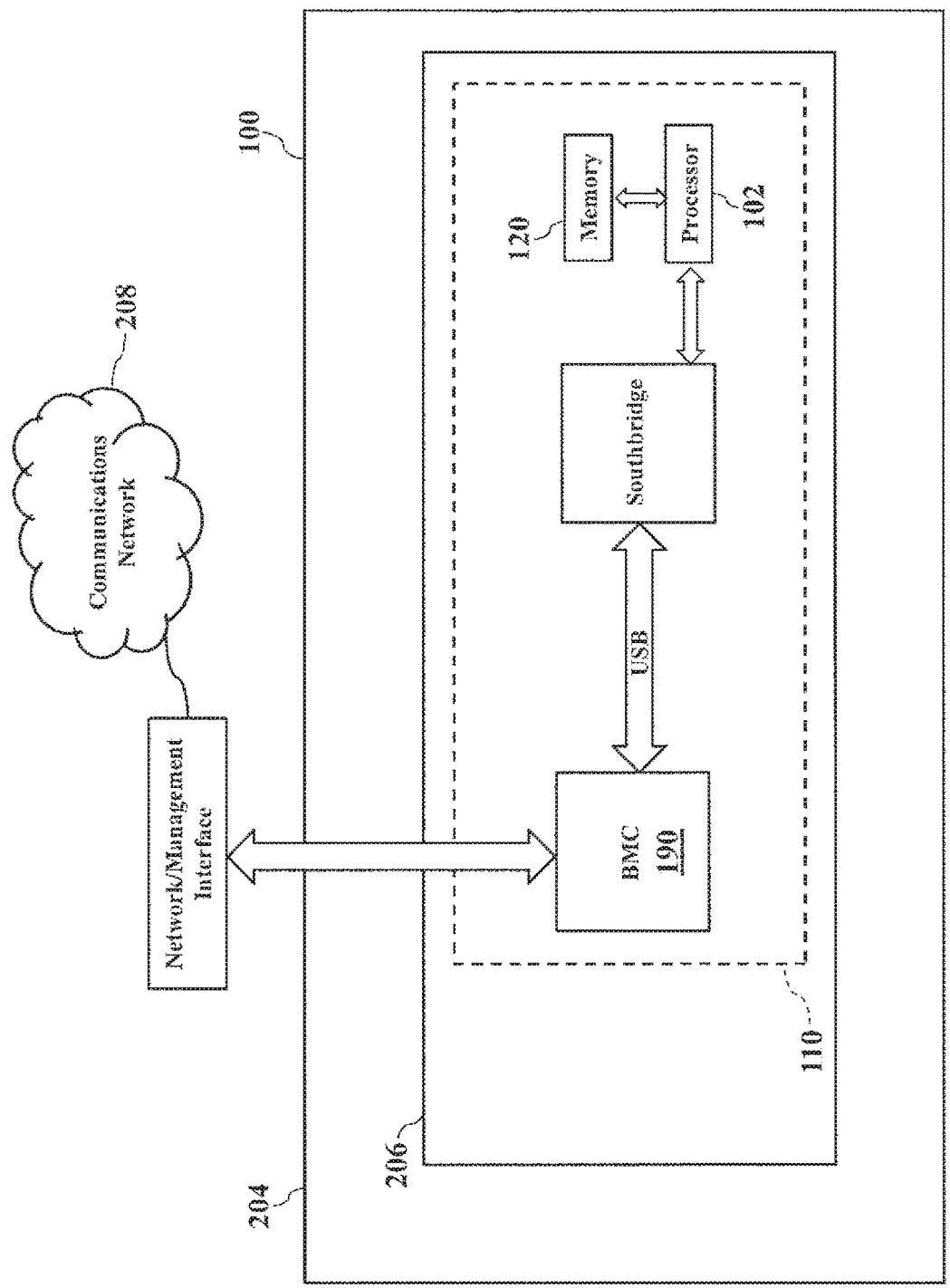
Figure 4:
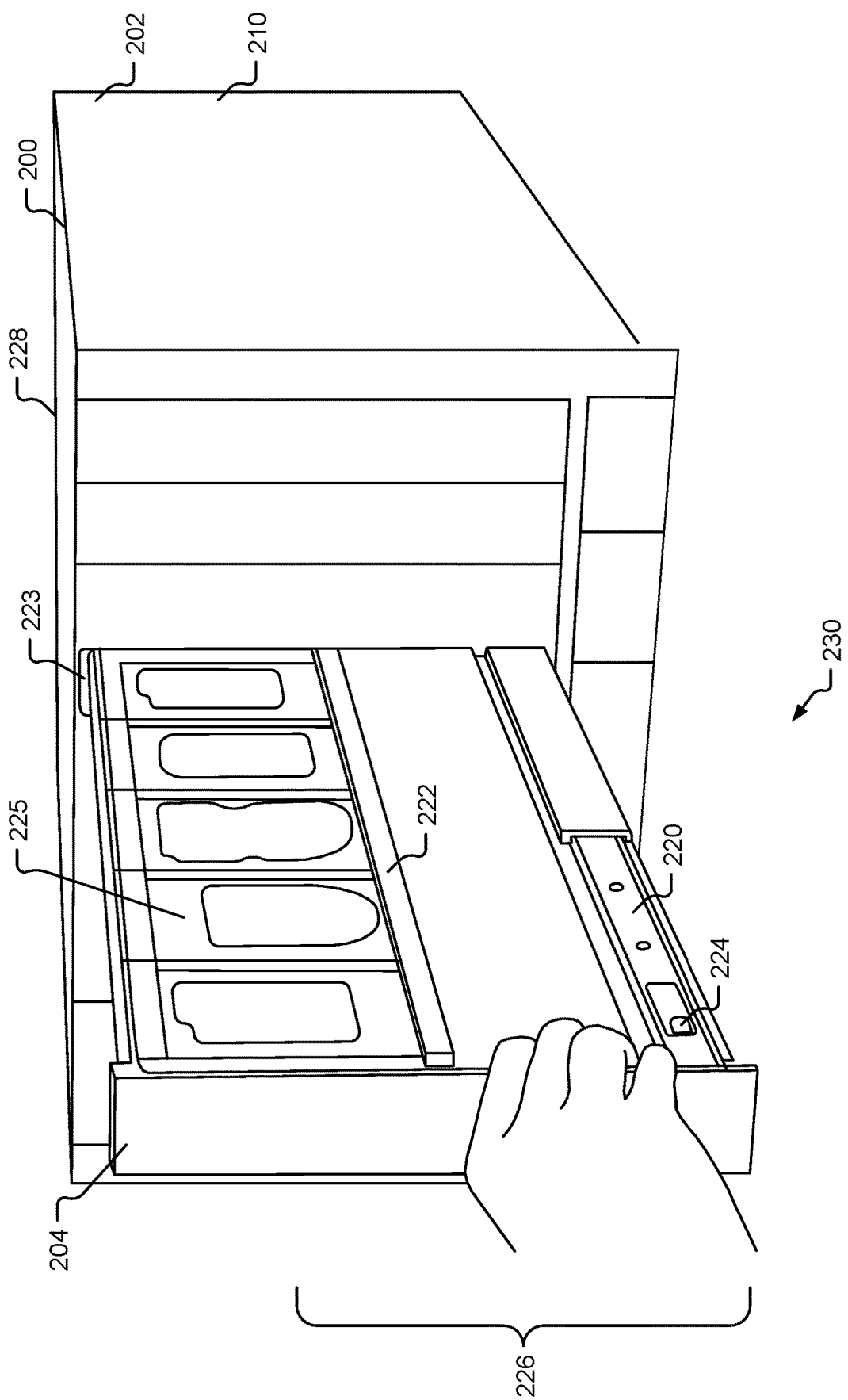

FIGS. 2-4 illustrate a blade server ecosystem 200 having a common chassis 202 that houses or contains multiple information handling systems conventionally termed "blades" or "sleds" 204. As FIG. 3 best illustrates, each individual computing blade or sled 204 may have its own corresponding baseboard management controller (BMC) 190. That is, each blade or sled 204 has a motherboard 206 comprising the chipset 110. Baseboard management controller 190 has its own management processor and memory device, not shown for simplicity, that interfaces with the motherboard 206 to provide side-band and out-of-band remote management (such as according to the Intelligent Platform Management Interface specification). The baseboard management controller 190 has one or more physical communications links and interfaces to the motherboard 206, thus allowing the baseboard management controller 190 to process messages according to the IPMI specification. The baseboard management controller 190 may thus monitor and remotely report the functions and performance of the corresponding blade or sled 204 via a separate network interface to a communications network 208. The baseboard management controller 190 and the IPMI specification are generally well known and thus need not be explained in detail.

Returning to FIG. 2, the blade server ecosystem 200 may also have one or more chassis management controllers 210. Because the blade server ecosystem 200 may have many individual or separate blades or sleds 204*a-n* (such as thirty two (32), as FIG. 2 illustrates), the chassis management controller 210 may control or manage the individual and/or overall hardware and software resources. While the chassis management controller 210 may have any physical location, FIG. 2 illustrates the chassis management controller 210 accessible via a rear of the chassis 202. The individual blades or sleds 204 communicate with the chassis management controller 210 (for example via I/O interfaces such as ISA, SCSI, I²C, SPI, and/or USB). The blade server ecosystem 200 and its internal hardware and software components are generally well known, so the known details need not be explained.

FIG. 4 illustrates removal of the blade or sled 204, according to exemplary embodiments. When a user wishes to access and/or to replace the blade or sled 204, the user releases one or more latch mechanisms 226 and outwardly pulls the blade or sled 204 from stowage within the chassis 202. That is, the blade or sled 204 is mounted or attached to a slider mechanism 220. The slider mechanism 220 has a drive drawer 222 mounted or affixed to extendable sliders 224. When the user successfully operates a release mechanism 226, the release mechanism 226 releases or unlocks the slider mechanism 220 and at least partially ejects the blade or sled 204 from within a bay 223 of the chassis 202. The user may then grasp and pull the drive drawer 222, thus fully extending the telescopic sliders 224 from within the chassis 202. Once the sliders 224 are nearly fully extended (perhaps to their full length), the user may thus access and/or replace the components of the blade or sled 204. As a common example, the user may replace or "hot-swap" storage drives 225 or other components within the blade or sled 204. When the user is finished servicing the blade or sled 204, the user may push the blade or sled 204 back into the bay 223 of the chassis 202, thus compressing or shortening the sliders 224. Once the drive drawer 222 is fully inserted back into the chassis 202, the release mechanism 226 re-engages and locks or retains the drive drawer 222 within the chassis 202.

Insufficient cooling is a problem. When the user outwardly pulls the blade or sled 204 from stowage within the chassis 202, sometimes referred to as hot swapping, the blade or sled 204 may remain electrically powered and operating. However when the drive drawer 222 is in an open or service position 230, such as fully extended along the sliders 224, the blade or sled 204 is not receiving cooling, convective air flow from a fan 228. The blade or sled 204 generates waste heat when electrically powered and operating. The blade server ecosystem 200 may thus include one or more fans 228 that provide convection cooling to the components within the chassis 202. When the fans 228 are electrically powered and operating, the fans 228 are commanded to spin at various voltages/speeds to push or pull ambient air over the blade or sled 204. So, when the drive drawer 222 is in the open or service position 230, the blade or sled 204 is still generating heat without the cooling effects provided by the fan 228. Design and performance specifications specify that the driver drawer 222 should not be in the open or service position 230 for longer than three (3) minutes in a fresh, ambient air environment. Moreover, the driver drawer 222 should not be exposed for longer than five (5) minutes at 35° C. However, it is not uncommon for the user to forget the drive drawer 222 is open, or even walk away, for many minutes. The user can return to an overheated, or even failed, sled due to insufficient cooling in the open or service position 230.

Figure 5:
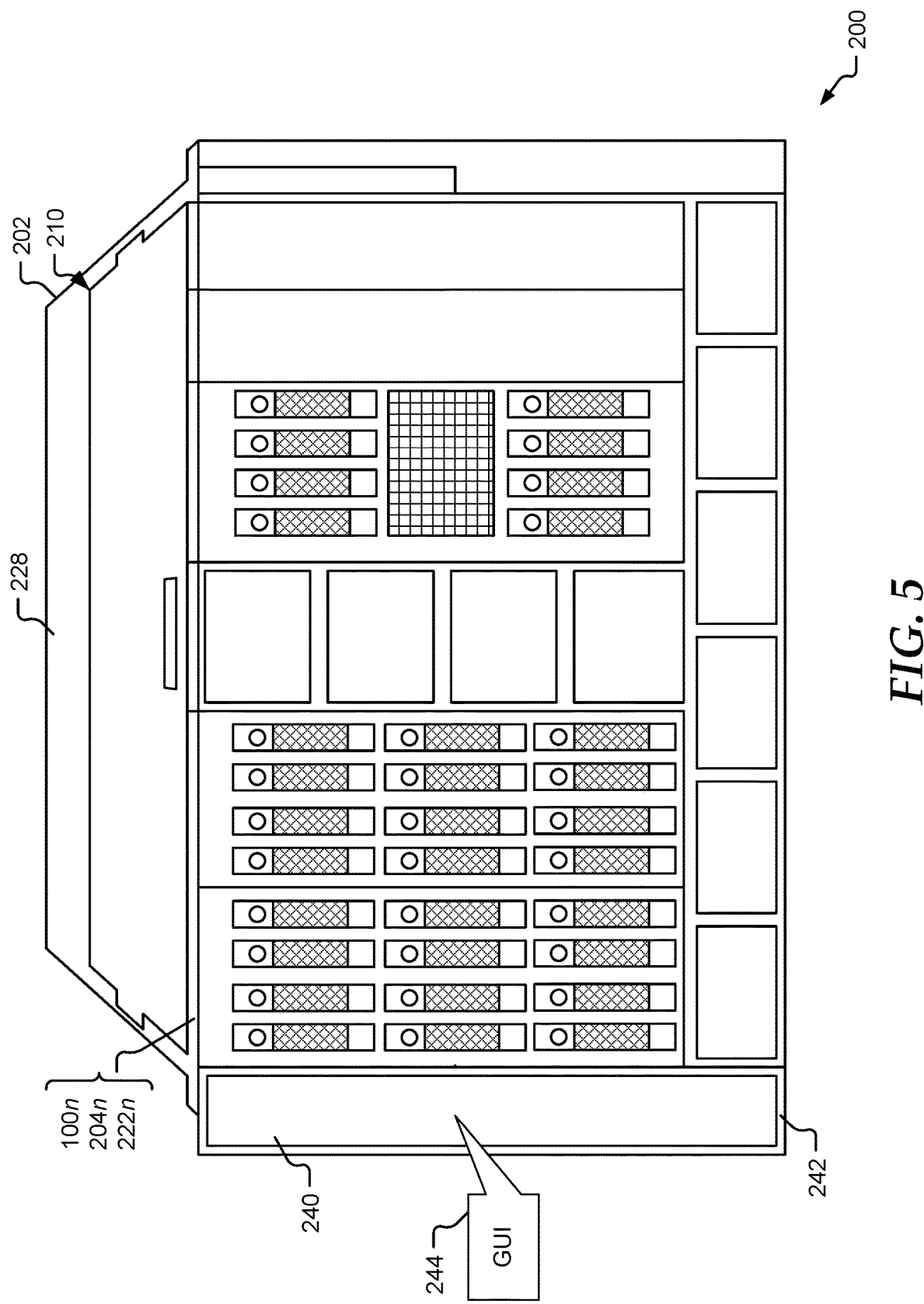
FIGS. 5, 6, and 7A-7E illustrate drawer notifications, according to exemplary embodiments.

FIGS. 5, 6, and 7A-7E illustrate drawer notifications, according to exemplary embodiments. The blade server ecosystem 200 incorporates a display device 240. FIG. 5 illustrates the display device 240 adapted into a front control panel 242 of the blade server ecosystem 200. The front control panel 242 is exposed and is accessible to the user during inspection and service. The display device 240 is connected to, coupled to, or commanded by the chassis management controller 210 to generate and display a graphical user interface (GUI) 244. The graphical user interface 244 visually displays an alert or other notification that the drive drawer 222 is open.

Figure 6:
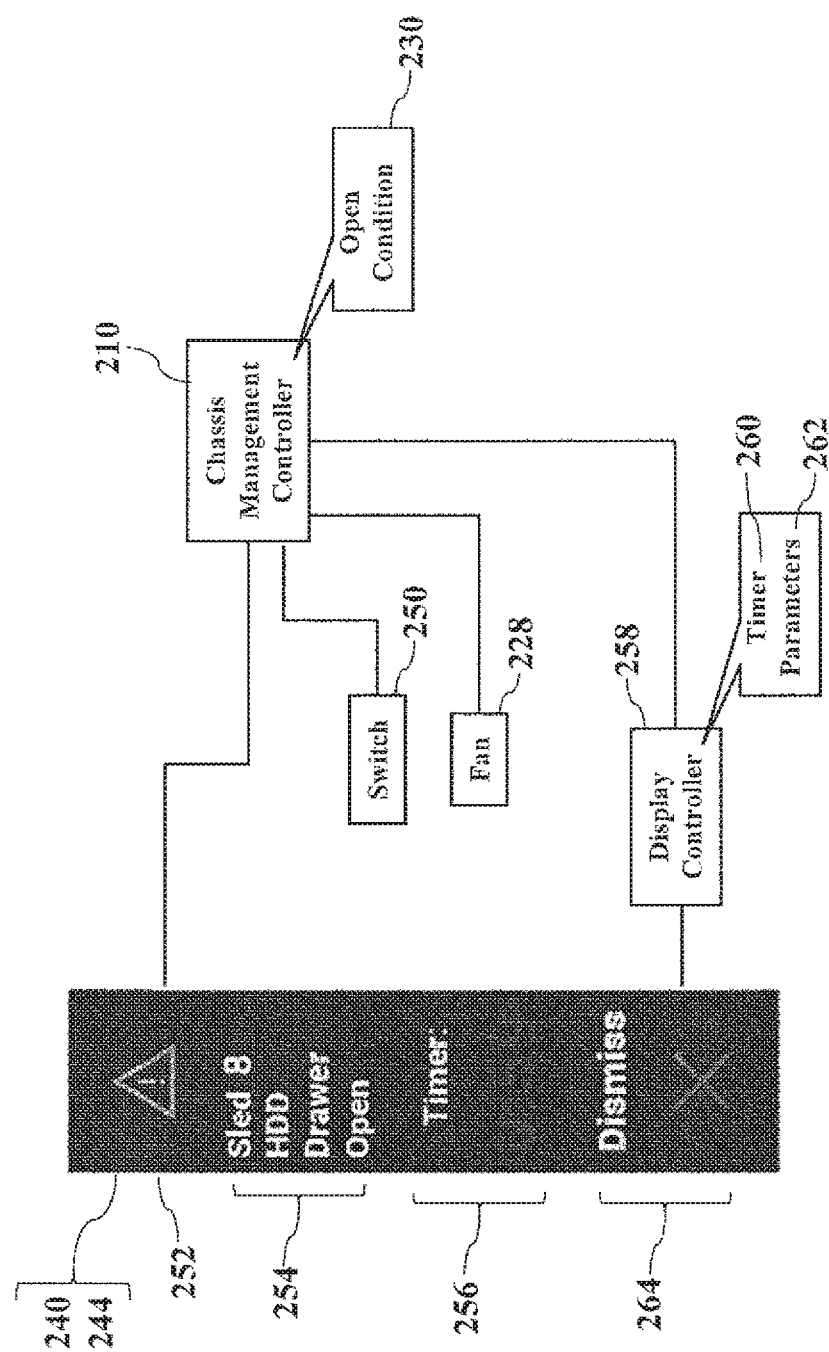

FIG. 6 further illustrates the graphical user interface 244. When the chassis management controller 210 detects that any drive drawer 222 is open (such as a real time or near real time controller event, without delay, in response to an open/closed drawer switch 250), the chassis management controller 210 may cause or instruct the cooling fan 228 to spin at a predetermined voltage/speed. The chassis management controller 210 may also cause or instruct the display device 240 to generate and to display the graphical user interface 244 alerting the user to the open condition 230 (such as the open driver drawer 222 illustrated in FIG. 4). For example, a visual, iconic warning symbol 252 may be displayed along with a drawer-specific message 254. The graphical user interface 244, for example, textually identifies the open drawer 222 (such as with a drawer or drive number or other identifier). Again, because there may be many blades or sleds 204a-n (as FIG. 2 illustrates), the graphical user interface 244 warns the user that the specific, identified driver drawer 222 is open.

The graphical user interface 244 may also display a current time value 256 associated with the open driver drawer 222. When the chassis management controller 210 determines or is informed of the open drive drawer 222, the chassis management controller 210 instructs a display controller 258 to call and to initialize a timer 260 that counts down, or increments, from an initial value such as zero to a final value. The graphical user interface 244 thus audibly and textually warns the user of an amount of time that the drive drawer 222 has been open. For example, the chassis management controller 210 may send a message to the display controller 258, and the message specifies data or information describing one or more timing parameters 262. The timing parameters 262 describe various initial values or start times, final values or stop times, and countdown values for multiple warning messages. The chassis management controller 210 and/or the display controller 258 may cooperate to audibly and/or visually warn the user when any drive drawer 22 is initially opened. As the timer 260 decrements to some value (as defined by the timing parameters 262), the chassis management controller 210 and/or the display controller 258 may provide additional, subsequent warning messages at various countdown values. While the user may use any mechanism to dismiss any warning message, FIG. 6 illustrates a capacitive, touch sensitive feature 264 for dismissing the iconic warning symbol 246 and/or the drawer-specific message 248.

Figure 7:
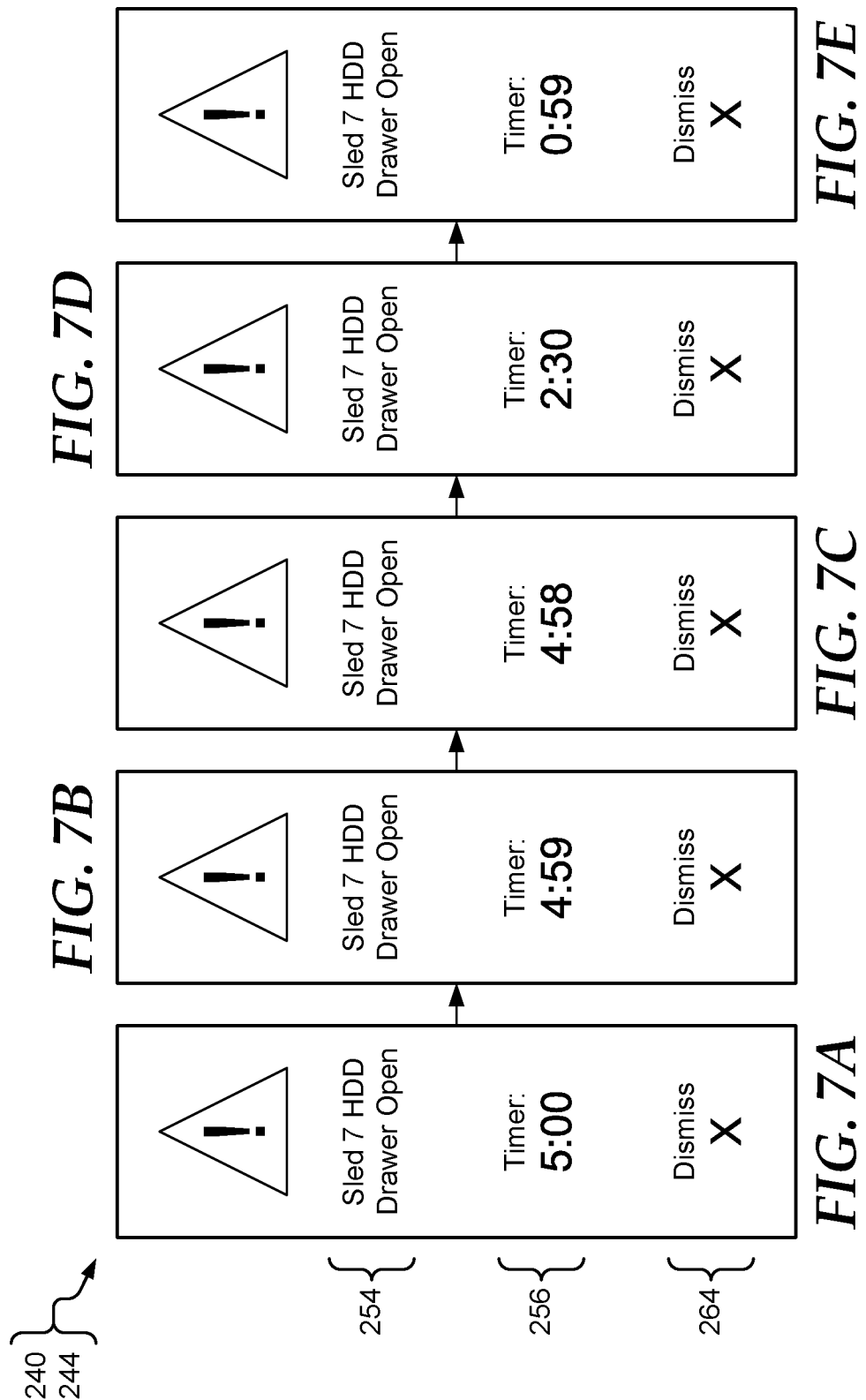

FIGS. 7A-7E illustrate a timed sequence of warning messages. When the user initially opens the drive drawer 222, the timer 260 initializes and FIG. 7A illustrates the initial time value 256 (such as five minutes) of the timer 260. FIGS. 7B-7C illustrate subsequent time values 256 of the timer 260 after the user initially opens the drive drawer 222. FIGS. 7D-7E illustrate the time values 256 with different coloring and/or fonting/typeface as further visual warnings.

The timer 260 may thus be a software/display widget that counts down in second increments. For accurate display refresh in seconds, the timer 260 may execute in the display controller 258. The execution of the timer 260 is defined by a set of timing parameters 262 provided by the chassis management controller 210. The timing parameters 262 are (a) start minute and second (b) alert minute and second (c) warning minute and second (d) start text color (e) alert text color (f) warning text color (g) expired text color. The "start" defines the time that the timer 260 starts. The "alert" defines the time that the timer 260 changes color to indicate an alert notification to user. The "warning" defines the time that the timer 260 changes color to indicate a warning notification to the user. Once the timer 260 reaches zero minute and zero second, the timer 260 changes to the "expired" color indicating a critical notification to the user to close the drawer 222.

As soon as the driver drawer 222 is opened, the display device 244 displays the initial time value 256 (such as five minutes) of the timer 260 and starts to countdown in one second increments. The current time value 256 displays in normal text color (or white). When the time value 256 reaches 2:30, the text color changes to a warning color (or amber). When the time value 256 reaches 0:59 seconds, the text color becomes critical color (or red). The timer value stops at 0:00 mark and remains in critical color (or red).

Figure 8:
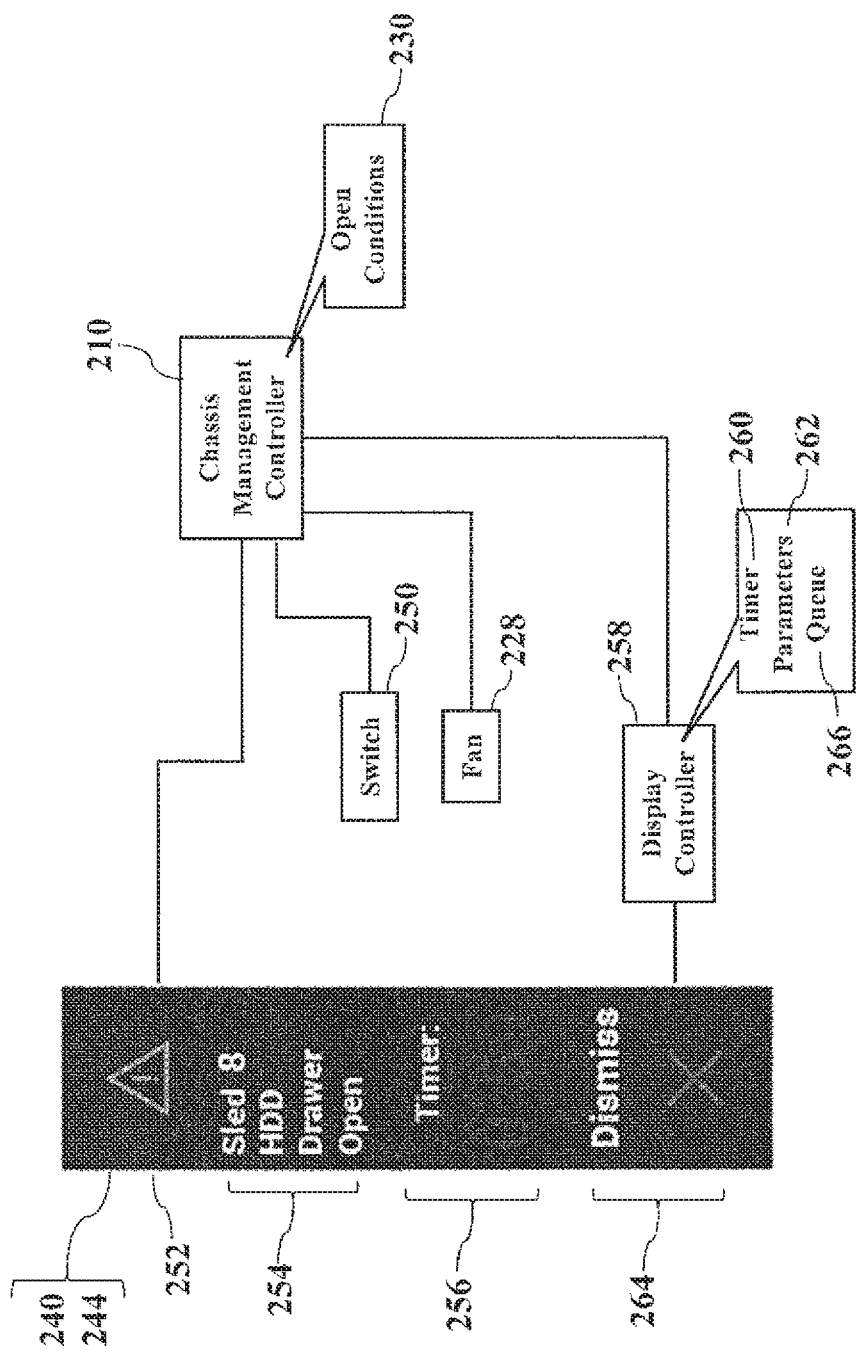
FIGS. 8-11 illustrate queueing of drawer notifications, according to exemplary embodiments.

FIGS. 8-11 illustrate queueing of drawer notifications, according to exemplary embodiments. Because there may be many blades or sleds 204a-n (as FIG. 2 illustrates), several different driver drawers 222a-n may be simultaneously open. That is, the user may open a first driver drawer 222a, thus causing the chassis management controller 210 and/or the display controller 258 to initialize the first timer 260a and to display the graphical user interface 244a. Then, while the first driver drawer 222a is open, the user may also open a second driver drawer 222b, thus causing the chassis management controller 210 and/or the display controller 258 to initialize a second timer 260b and perhaps display the graphical user interface 244b. The user may still open other driver drawers 222c-n and initialize additional timers 260c-n. FIG. 8 thus illustrates a queue 266 stored by the display controller 258. The queue 266 stores/queues multiple timing parameters 262 defining multiple timers 260 that correspond to each open drive drawers 222.

Figure 9:
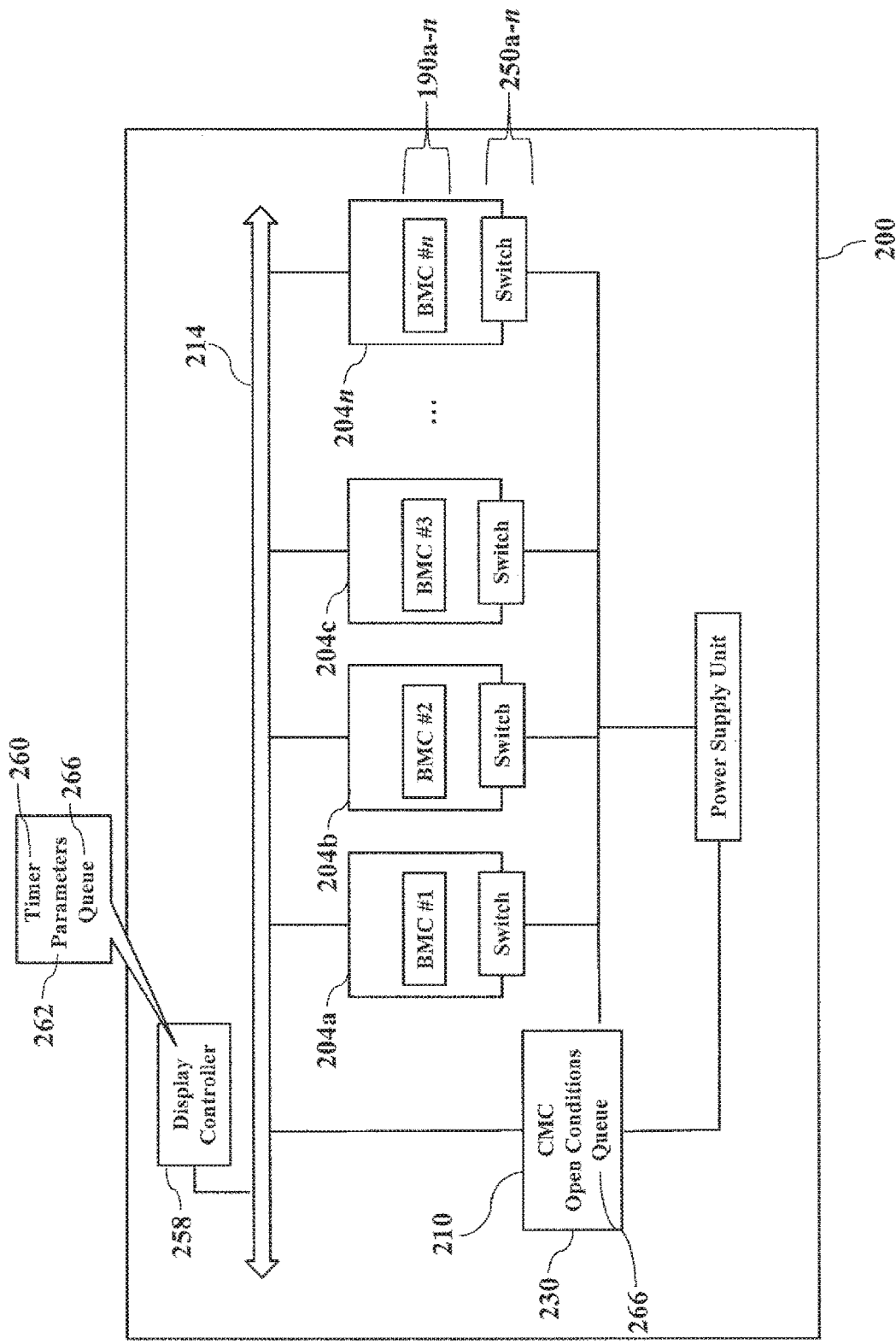

FIG. 9 illustrates multiple open conditions 230. The chassis management controller 210 interfaces with each baseboard management controller 190. Moreover, the chassis management controller 210 may also interface with each switch 250a-n that detects or signals the corresponding open condition 230. The chassis management controller 210 and the display controller 258 may then cooperate to establish the corresponding timer 260 that counts down according to the timing parameters 262.

Figure 10:
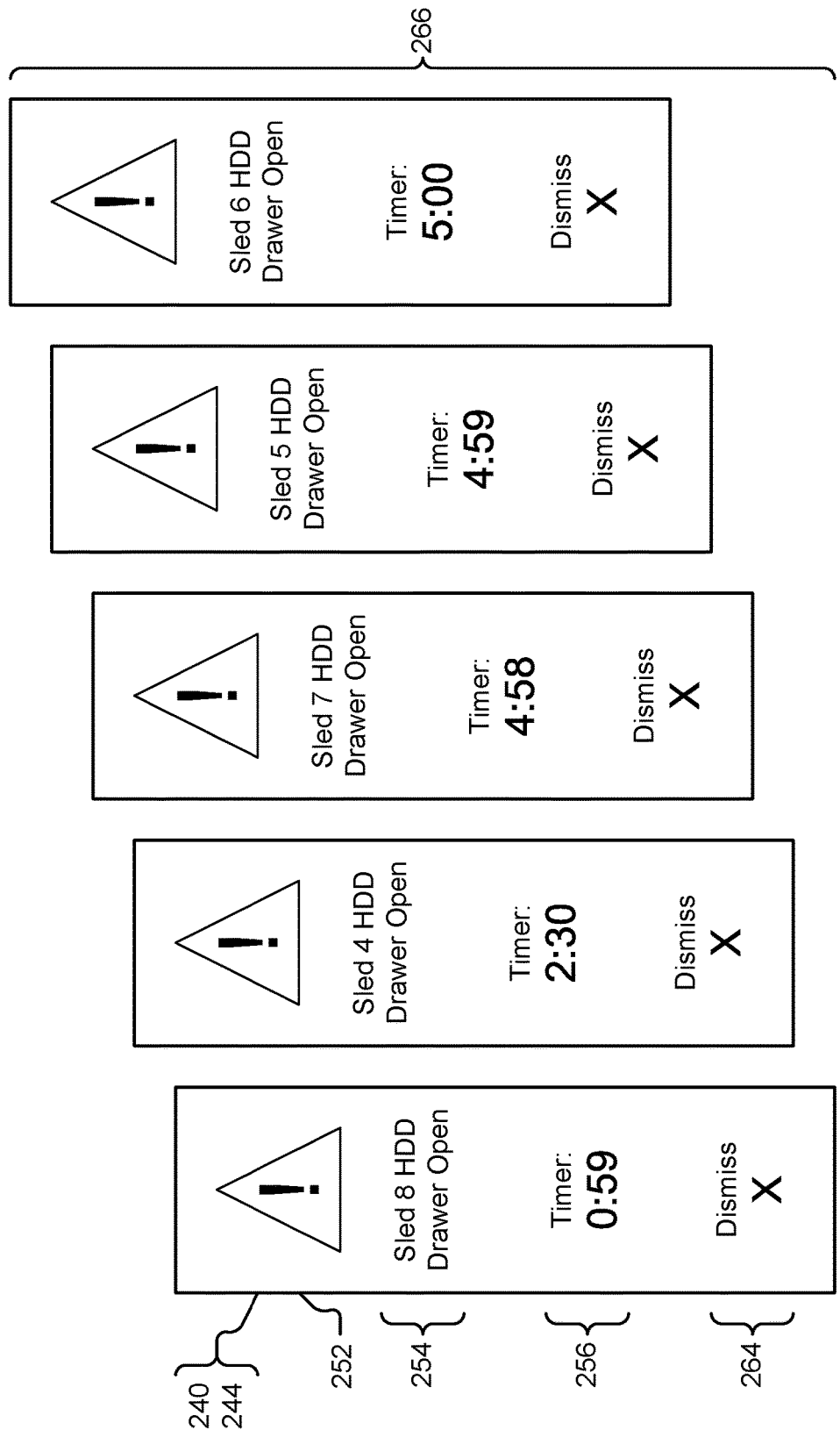

FIG. 10 illustrates the queue 266 of multiple drawer notifications. Because multiple driver drawers 222 are open, the chassis management controller 210 receives and queues multiple open conditions 230 (each corresponding to the particular, identified drive drawer 222). The chassis management controller 210 and the display controller 258 may then cooperate to generate and/or to display multiple graphical user interfaces 244 alerting the user to the several open conditions 230. While the multiple graphical user interfaces 244 may be toggled and displayed in any order, FIG. 10 illustrates a sequential queueing. That is, the first detected/determined open condition 230 causing the first drawer-specific message 254 (corresponding to "Sled 8") is actively displayed. However, subsequently, another open condition is detected 230 and its corresponding drawer-specific message 254 (corresponding to "Sled 4") is queued according to time.

Later, sleds "7," "5," and "4" are subsequently and sequentially opened, so their corresponding drawer-specific messages 254 are added to the queue 266 for displayed. Each sequential open condition 230 may thus be added at the back of the queue 266. Each open drawer notifications 244 in the queue 266 is assigned a timestamp (perhaps assigned by the chassis management controller 210 and/or the display controller 258, according to a master clock or other timing mechanism). Once the current open drawer notification (such as drawer-specific message 254) is dismissed (such as via the display device 240), the display device 240 is instructed to display the next open drawer alert notification in the queue 266.

Figure 11:
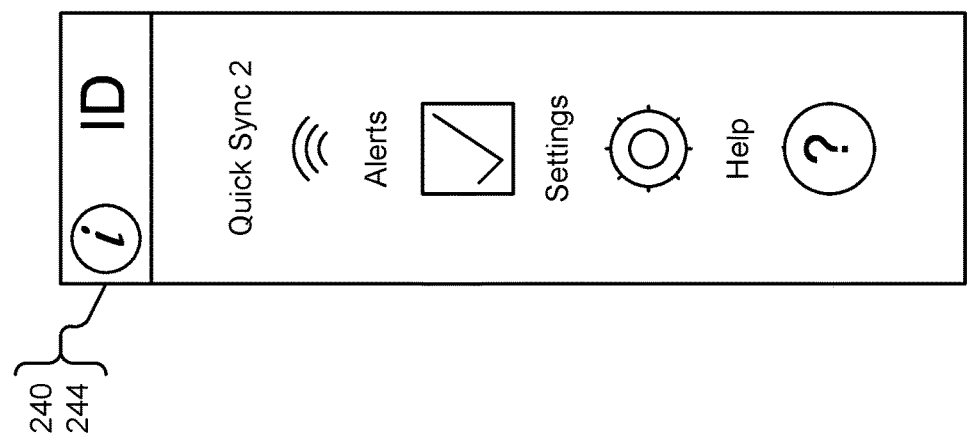

The display controller 258 may thus display the oldest open drawer notification (such as the oldest drawer-specific message 254 according to its corresponding timestamp). The countdown timer 260 determines a difference between the current master time and the open event timestamp. If the difference is larger than five seconds, the countdown timer 260 defaults to zero (0). When the last open drawer notification is dismissed, the display device 240 is instructed to display a home menu (as FIG. 11 illustrates). The display controller 258 may store the different graphical user interfaces 244 (each corresponding to the open drawer alert notification in the queue 266) in the display background in the order the events occurred.

The chassis management controller 210 detects if an open drawer 222 has been closed by the user. On a real time or near real time close drawer event, the chassis management controller 210 finds an entry match in the open alert queue 266 by slot number and removes/deletes the matching entry from the queue 266. If the match is the first in the queue 266, this is the currently displayed open drawer notification and instructs display device 240 to dismiss it and replace with the next item in the queue 266. When user touches/presses the "dismiss" region 264 in the display device 240, the current notification goes away and it is replaced by the next open drawer notification in the queue 266.

The chassis management controller 210 may thus inform or warn the user (via the display device 240) at-the-box exactly how long has the storage drawer 222 been open (in minutes and seconds). The chassis management controller 210 may also warn the user with colored critical alerts via the countdown timer 166. The user may thus prioritize which open driver/storage drawer 222 to complete work in sequence through the open drawer alert queue 266.

Figure 12:
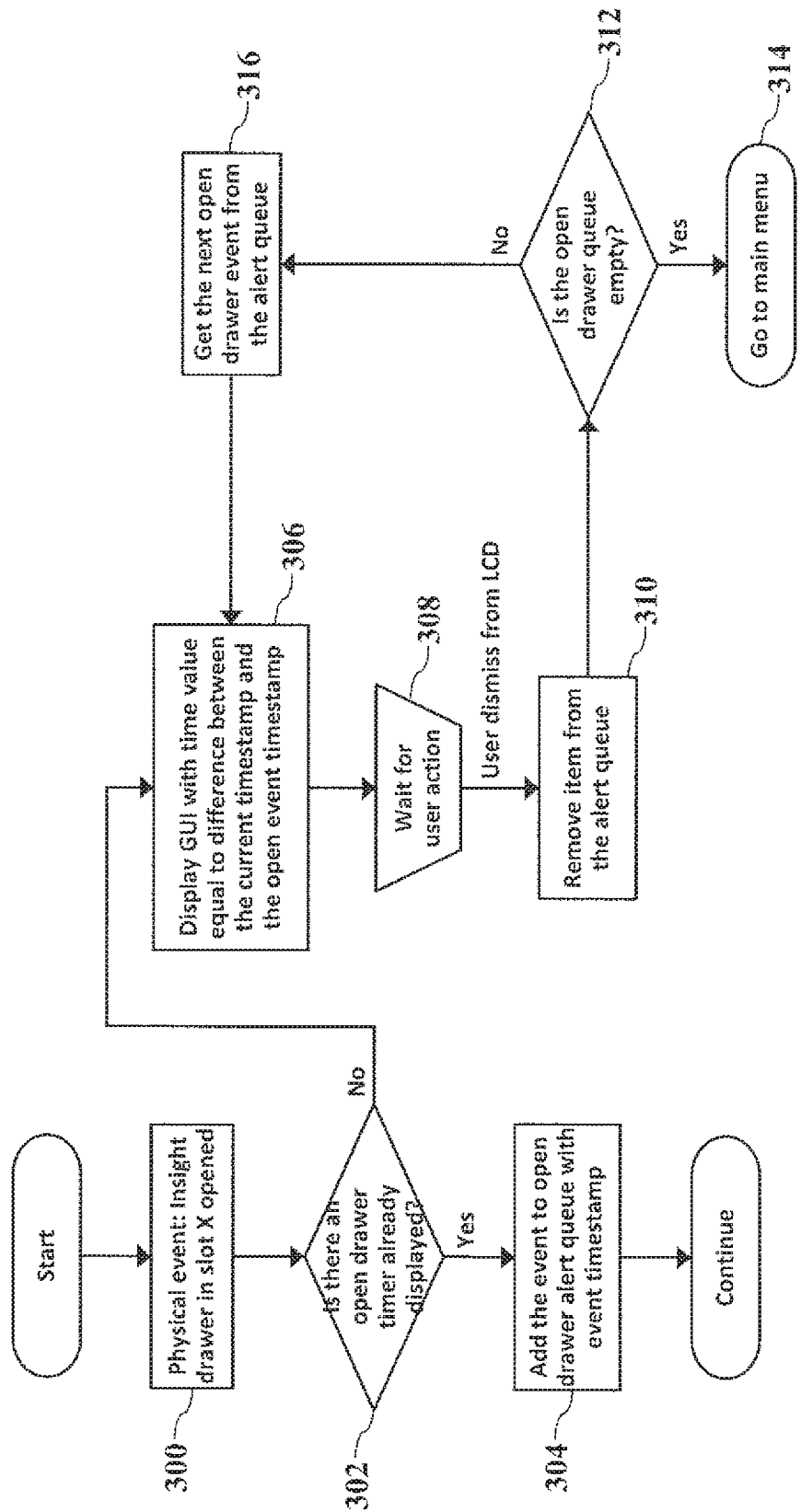
FIG. 12 is a flowchart illustrating a method or algorithm for alert notifications of open driver drawers, according to exemplary embodiments.

FIG. 12 shows a method or algorithm for alert notifications of open driver drawers 222, according to exemplary embodiments. The chassis management controller 210 receives the open condition 230 as any real time without delay event indicating the corresponding driver drawer 222 is open (Block 300). If the display device 240 is currently displaying an open drawer notification (Block 302), then the event is added to the queue 266 with a timestamp (Block 304. However, if the display device 240 is not currently displaying an open drawer notification (Block 302), then the display controller 258 causes the display device 240 to display the graphical user interface 244 (such as the drawer-specific message 254) (Block 306). The display device 240, the display controller 258, and/or the chassis management controller 210 awaits a user input that dismisses the open drawer notification (Block 308). When the user dismisses the currently-displayed open drawer notification, the open drawer notification is removed from the queue 266 (Block 310). If the queue 266 is empty (Block 312), then the display device 240, the display controller 258, and/or the chassis management controller 210 cause display of a home menu (Block 314). However, if the queue 266 is populated with additional open drawer notifications (Block 312), then the next open drawer notification is identified and retrieved from the queue 266 (Block 316) and displayed (Block 306).

Figure 13:
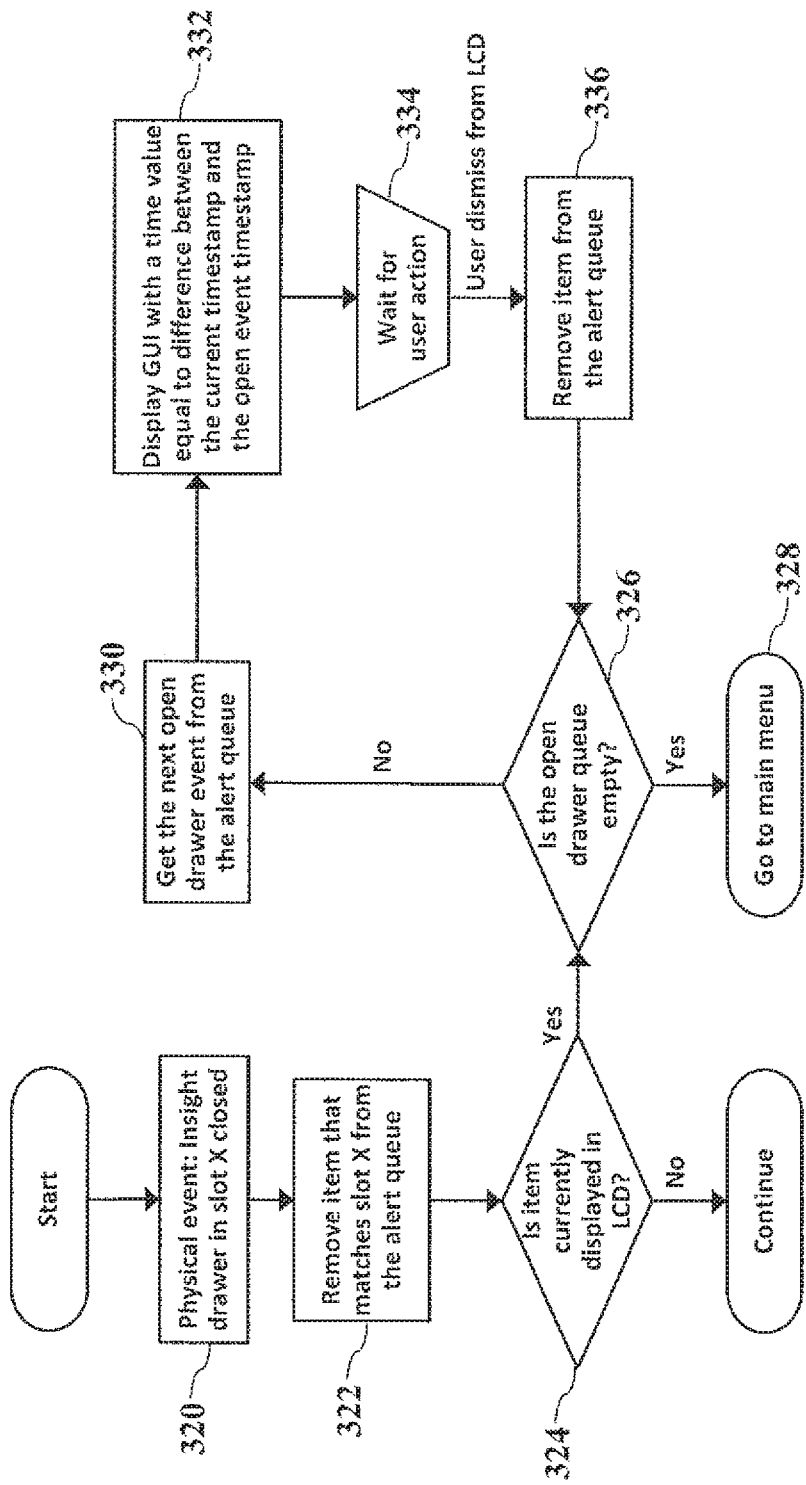
FIG. 13 is a flowchart illustrating a method or algorithm for alert notifications of closed driver drawers, according to exemplary embodiments.

FIG. 13 shows a method or algorithm for alert notifications of closed driver drawers 222, according to exemplary embodiments. The chassis management controller 210 receives a closed condition as any real time without delay event indicating the corresponding driver drawer 222 is closed (Block 320). The corresponding, matching drive entry in the queue 266 is removed/deleted (Block 322). If the display device 240 is not currently displaying an open drawer notification that corresponds to the closed drive drawer 222 (Block 324), then the chassis management controller 210 awaits receipt of another real time event indicating a closed drive drawer (Block 320). However, if the display device 240 is currently displaying an open drawer notification that corresponds to the closed drive drawer 222 (Block 324), the queue 266 is checked for additional entries (Block 326). If the queue 266 is empty (Block 326), then the display device 240, the display controller 258, and/or the chassis management controller 210 cause display of a home menu (Block 328). However, if the queue 266 is populated with additional drawer notifications (Block 326), then the next open drawer notification is identified and retrieved from the queue 266 (Block 330) and displayed (Block 332). The display device 240, the display controller 258, and/or the chassis management controller 210 awaits a user input that dismisses the open drawer notification (Block 334). When the user dismisses the currently-displayed open drawer notification, the open drawer notification is removed from the queue 266 (Block 336).

Figure 14:
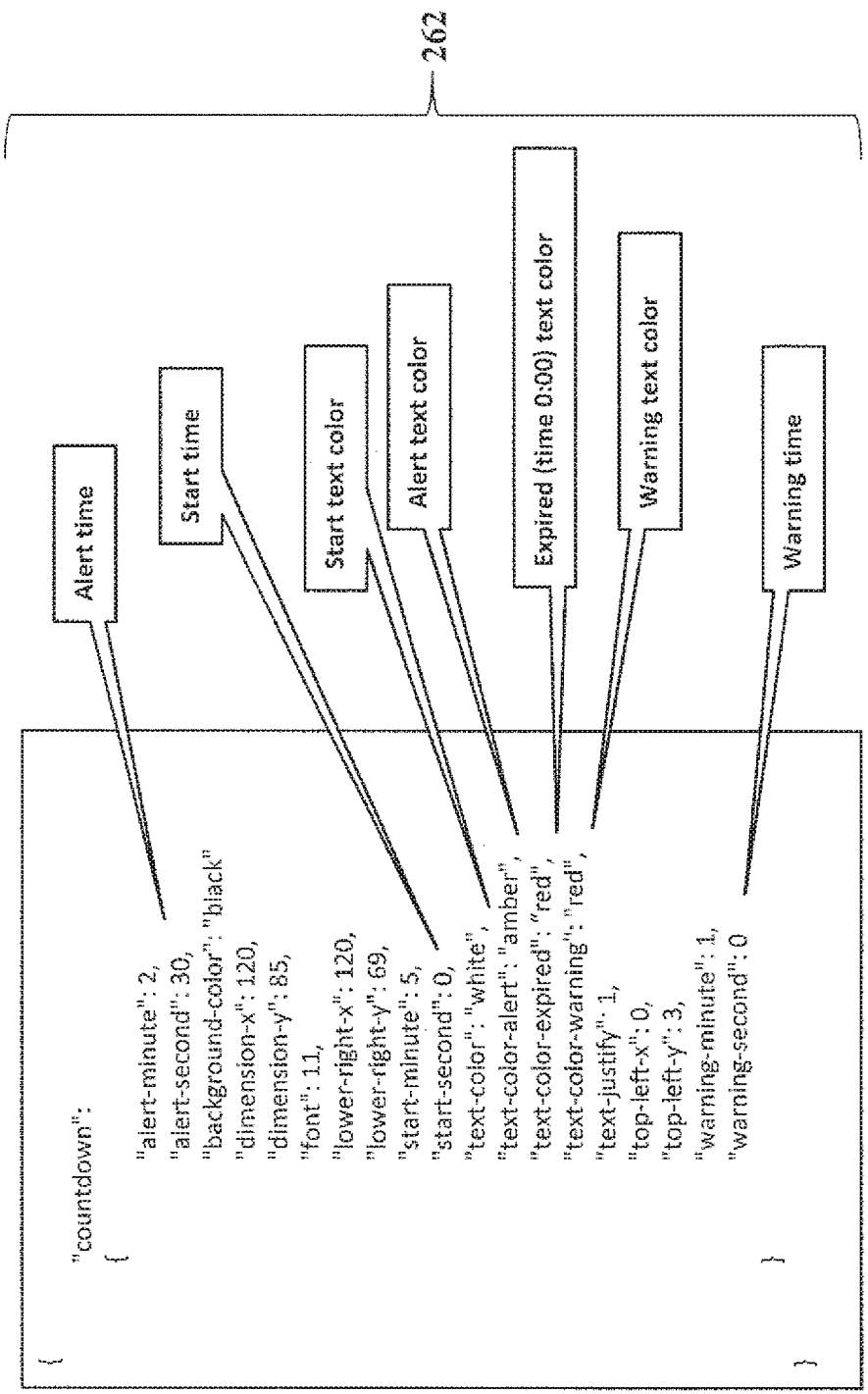
FIG. 14 illustrates an algorithm for drawer notifications, according to exemplary embodiments.

FIG. 14 illustrates an algorithm for drawer notifications, according to exemplary embodiments. When any drive drawer 222 is opened, the chassis management controller 210 detects or receives the real time event notification (such as the open condition 230 explained with reference to FIG. 6). The chassis management controller 210 retrieves and sends the timing parameters 262 to the display controller 258, and the chassis management controller 210 and/or the display controller 258 cooperate to warn the user with the drawer-specific message 254. FIG. 14 thus illustrates programming statements containing fields defined by the timing parameters 262. The display controller 258 may populate the programming statements with the timing parameters 262 received from the chassis management controller 210. The programming statements specify the times and textual warnings that are displayed by the display device 240.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system can be a personal computer, a laptop computer, a smart phone, a tablet device or other consumer electronic device, a network server, a network storage device, a switch router or other network communication device, or any other suitable device and may vary in size, shape, performance, functionality, and price. Further, an information handling system can include processing resources for executing machine-executable code, such as a central processing unit (CPU), a programmable logic array (PLA), an embedded device such as a System-on-a-Chip (SoC), or other control logic hardware. An information handling system can also include one or more computer-readable medium for storing machine-executable code, such as software or data. Additional components of information handling system can include one or more storage devices that can store machine-executable code, one or more communications ports for communicating with external devices, and various input and output (I/O) devices, such as a keyboard, a mouse, and a video display. An information handling system can also include one or more buses operable to transmit information between the various hardware components.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method, comprising:
receiving, by a chassis management controller operating in an information handling system, an event notification indicating an opening of a drive drawer;
retrieving, by the chassis management controller, a final time value indicating a maximum time the drive drawer is open before overheating;
sending, by the chassis management controller, a message to a display controller operating in the information handling system, the message specifying the final time value indicating the maximum time the drive drawer is open before overheating;
receiving, by the display controller operating in the information handling system, the message from the chassis management controller;
in response to the receiving of the message from the chassis management controller, initializing, by the display controller operating in the information handling system, a timer that increments from an initial value representing an open time that the drive drawer is open;
displaying, by the display controller operating in the information handling system, a current value associated with the timer that represents the open time that the drive drawer is open; and
displaying, by the display controller operating in the information handling system, a visual alert in response to the current value of the timer equaling the final time value specified by the message received from the chassis management controller.

2. The method of claim 1, further comprising displaying a graphical user interface indicating the current value associated with the timer.

3. The method of claim 1, further comprising displaying an identifier associated with the drive drawer.

4. The method of claim 1, further comprising receiving an input that dismisses the timer.

5. The method of claim 1, further comprising electrically powering a fan.

6. The method of claim 1, further comprising timestamping the receiving of the event notification indicating the opening of the drive drawer.

7. A system, comprising:
a hardware server; and
a memory device storing instructions that when executed by the hardware server perform operations including:
receiving a message sent from a chassis management controller to a display controller operating in the hardware server, the message indicating an opening of a drive drawer;
determining a final time value specified by the message indicating a maximum time the drive drawer is open before overheating;
in response to the receiving of the message, initializing a timer by the display controller that increments from an initial value representing an open time that the drive drawer is open;
generating a visual alert by the display controller that alerts of the opening of the drive drawer;
displaying a current value associated with the timer by the display controller, the current value associated with the timer indicating the open time since the receiving of the message sent from the chassis management controller; and alerting when the current value associated with the timer equals the final time value specified by the message indicating the maximum time the drive drawer is open before overheating.

8. The system of claim 7, wherein the operations further include displaying a graphical user interface indicating the current value associated with the timer.

9. The system of claim 7, wherein the operations further include displaying an identifier associated with the drive drawer.

10. The system of claim 7, wherein the operations further include receiving an input that dismisses the visual alert that alerts of the opening of the drive drawer.

11. The system of claim 7, wherein the operations further include electrically powering a fan.

12. The system of claim 7, wherein the operations further include timestamping the opening of the drive drawer.

13. A memory device storing instructions that when executed by a hardware processor perform operations, the operations including:
   receiving a message sent from a chassis management controller to a display controller operating in a hardware server, the message indicating an opening of a drive drawer;
   determining a final time value specified by the message indicating a maximum time the drive drawer is open before overheating;
   in response to the receiving of the message, initializing a timer by the display controller that increments from an initial value representing an open time that the drive drawer is open;
   in response to the receiving of the message, generating a visual alert by the display controller that alerts to the opening of the drive drawer;
   generating a visual display of a current value associated with the timer, the current value associated with the timer indicating the open time that the drive drawer is open; and
   alerting when the current value associated with the timer equals the final time value specified by the message indicating the maximum time the drive drawer is open before overheating.

14. The memory device of claim 13, wherein the operations further include displaying a graphical user interface indicating the current value associated with the timer.

15. The memory device of claim 13, wherein the operations further include displaying an identifier associated with the drive drawer.

16. The memory device of claim 13, wherein the operations further include receiving an input that dismisses the visual alert of the opening of the drive drawer.

17. The memory device of claim 13, wherein the operations further include electrically powering a fan.

\* \* \* \* \*